US012630416B2

(12) United States Patent
Chong et al.

(10) Patent No.: US 12,630,416 B2
(45) Date of Patent: May 19, 2026

(54) MICRO-ELECTRO-MECHANICAL SYSTEM (MEMS) DEVICE AND FABRICATION METHOD THEREOF

(71) Applicant: Vanguard International Semiconductor Corporation, Hsinchu (TW)

(72) Inventors: Wai Mun Chong, Singapore (SG); Rakesh Chand, Singapore (SG); Guofu Zhou, Singapore (SG); Rohit Pulikkal Kizhakkeyil, Singapore (SG); Ramachandramurthy Pradeep Yelehanka, Singapore (SG)

(73) Assignee: Vanguard International Semiconductor Corporation, Hsinchu (TW)

( * ) Notice: Subject to any disclaimer, the term of this patent is extended or adjusted under 35 U.S.C. 154(b) by 783 days.

(21) Appl. No.: 17/732,467

(22) Filed: Apr. 28, 2022

(65) Prior Publication Data

US 2023/0348259 A1 Nov. 2, 2023

(51) Int. Cl.
| | |
|---|---|
| *B81B 3/00* | (2006.01) |
| *B81C 1/00* | (2006.01) |
| *G01C 19/5719* | (2012.01) |
| *G01P 15/08* | (2006.01) |
| *G01P 15/125* | (2006.01) |

(52) U.S. Cl.
CPC ........ B81B 3/0051 (2013.01); B81C 1/00341 (2013.01); G01C 19/5719 (2013.01); G01P 15/0802 (2013.01); G01P 15/125 (2013.01); B81B 2201/0235 (2013.01); B81B 2201/0242 (2013.01); B81B 2201/025 (2013.01); B81B 2203/0136 (2013.01); B81B 2207/012

(2013.01); *B81C 2201/0132* (2013.01); *B81C 2201/0178* (2013.01); *B81C 2201/019* (2013.01); *B81C 2203/0792* (2013.01); *G01P 2015/086* (2013.01); *G01P 2015/0871* (2013.01)

(58) Field of Classification Search
CPC .............. B81B 3/0051; G01C 19/5719; G01P 15/0802; G01P 15/125
See application file for complete search history.

(56) References Cited

U.S. PATENT DOCUMENTS

| | | | | |
|---|---|---|---|---|
| 7,237,316 | B2 * | 7/2007 | Sakamoto | G01P 15/00 |
| | | | | 73/514.16 |
| 2018/0127263 | A1 * | 5/2018 | Tai | B81B 3/0008 |
| 2018/0134543 | A1 * | 5/2018 | Kuang | B81B 3/0051 |
| 2021/0130167 | A1 * | 5/2021 | Chen | B81B 3/0072 |
| 2021/0179419 | A1 * | 6/2021 | Cheng | G01C 19/5769 |

* cited by examiner

*Primary Examiner* — Britt Hanley
*Assistant Examiner* — Victor V Barzykin
(74) *Attorney, Agent, or Firm* — Winston Hsu

(57) ABSTRACT

A micro-electro-mechanical system (MEMS) device includes a supporting substrate, a cavity, a stopper, a MEMS structure, and a bonding dielectric layer. The cavity is located at a top surface of the supporting substrate. The stopper is adjacent to the cavity, where a top surface of the stopper and the top surface of the supporting substrate are on the same level in a height. The MEMS structure is disposed on the supporting substrate, where the MEMS structure includes a proof mass and a suspension beam. The proof mass is disposed directly above the stopper, and the suspension beam is disposed directly above the cavity. The bonding dielectric layer is disposed between the top surface of the supporting substrate and a bottom surface of the MEMS structure.

19 Claims, 10 Drawing Sheets

MICRO-ELECTRO-MECHANICAL SYSTEM (MEMS) DEVICE AND FABRICATION METHOD THEREOF

BACKGROUND OF THE INVENTION

1. Field of the Invention

The present disclosure relates generally to micro-electro-mechanical system (MEMS) devices, and more particularly to MEMS devices including a stopper corresponding to a proof mass and fabrication methods thereof.

2. Description of the Prior Art

Recently, MEMS devices are an enabling technology and have gained increased attention in the microelectronics industries. MEMS devices include, for example gyroscopes, accelerometers, resonators, pressure sensors, etc. A MEMS device may include a sense mass and a beam to support the sense mass. The sense mass and the beam are disposed in a sealed chamber and suspended over a cavity of a lower semiconductor substrate. During the operation of the MEMS device, the sense mass and the beam can be displaced from their positions or even vibrate in the sealed chamber. The beam and the sense mass are usually formed using a micro-machining process that selectively etches away parts of a thinned device substrate. However, it is difficult to form both a thinner support beam with a uniform pattern (such as uniform width/pitch) and a heavy sense mass together in the etching process of the thinned device substrate. As a result, the pattern of the thinner support beam is not uniform, thereby reducing the production yield and the reliability of the MEMS devices. Thus, there is a need for improved MEMS devices and fabrication methods thereof to overcome the aforementioned problems.

SUMMARY OF THE INVENTION

In view of this, embodiments of the present disclosure provide improved MEMS devices and fabrication methods thereof. The MEMS devices include a suspension beam with a uniform pattern and no striation at the sidewalls of the suspension beam. In addition, the MEMS devices include a precise controlled gap between a proof mass and a stopper thereof. The embodiments of the present disclosure improve the reliability and the production yield of the MEMS devices, and increase product flexibility of fabricating the MEMS devices.

According to one embodiment of the present disclosure, a micro-electro-mechanical system (MEMS) device is provided and includes a supporting substrate, a cavity, a stopper, a MEMS structure, and a bonding dielectric layer. The cavity is located at a top surface of the supporting substrate. The stopper is adjacent to the cavity, where a top surface of the stopper and the top surface of the supporting substrate are on the same level in a height. The MEMS structure is disposed on the supporting substrate, where the MEMS structure includes a proof mass and a suspension beam. The proof mass is disposed directly above the stopper, and the suspension beam is disposed directly above the cavity. The bonding dielectric layer is disposed between the top surface of the supporting substrate and a bottom surface of the MEMS structure.

According to one embodiment of the present disclosure, a method of fabricating a MEMS device is provided and includes the following steps. A supporting substrate is provided and etched to form a cavity and a stopper at a top surface of the supporting substrate. A bonding dielectric layer is formed on the top surface of the supporting substrate and on a top surface of the stopper. A MEMS device layer is disposed on the bonding dielectric layer, where the MEMS device layer is bonded to the stopper and the supporting substrate. The MEMS device layer is patterned to form a MEMS structure, where the MEMS structure includes a proof mass and a suspension beam. The proof mass is bonded to the stopper, and the suspension beam is formed directly above the cavity. A portion of the bonding dielectric layer disposed between the stopper and the proof mass is removed to form a gap between the stopper and the proof mass.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
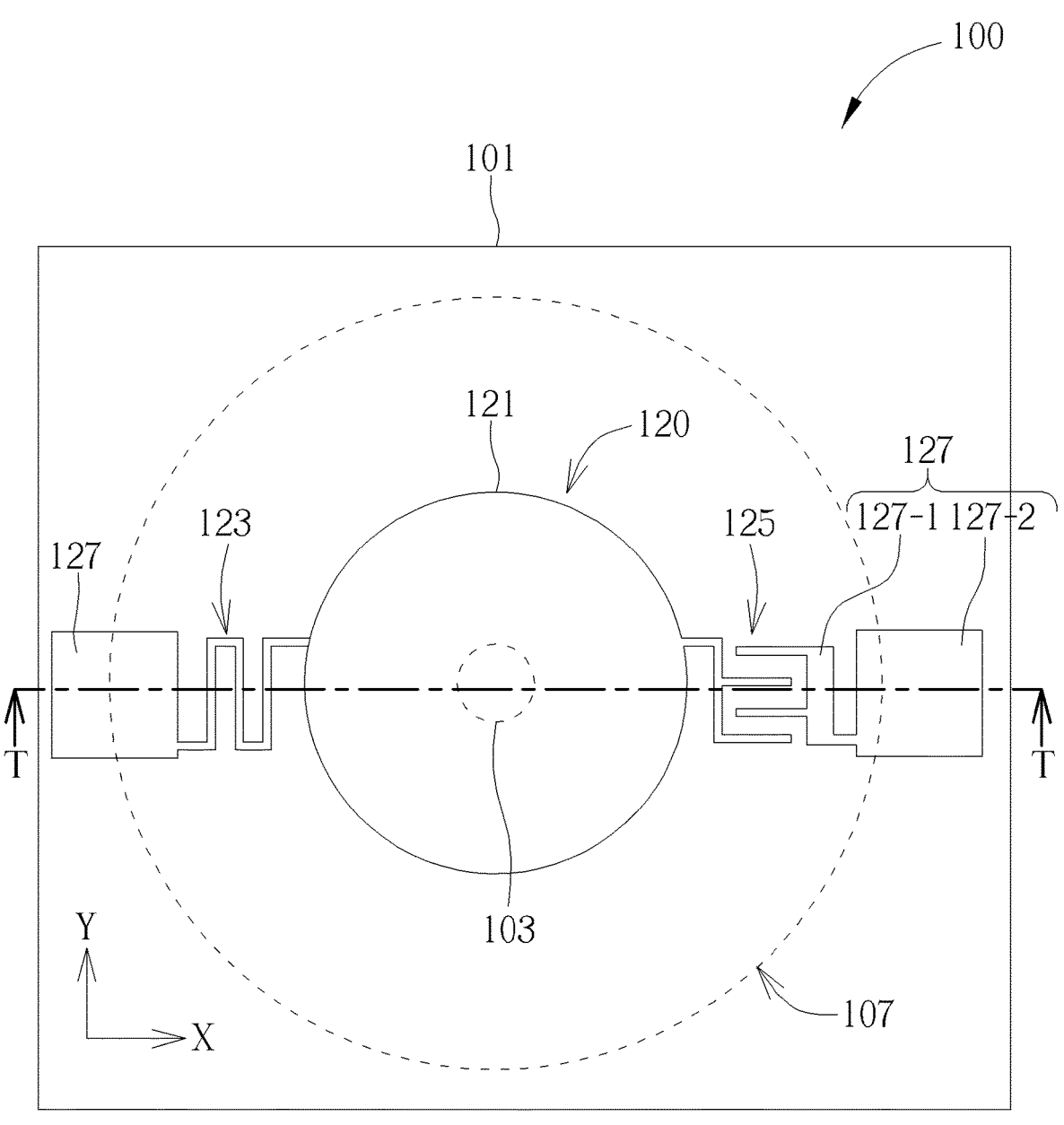
FIG. 1 shows a schematic top view of a MEMS device according to some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "under", "on", "over", "above", "upper", "bottom", "top" and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. For example, if the device in the figures is turned over, elements described as "below" and/or "under" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first", "second", and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that may vary as desired.

The present disclosure is directed to MEMS devices and fabrication methods thereof. The MEMS devices include an inertial measurement unit (IMU), for example an accelerometer, a gyroscope, etc. A supporting substrate of the MEMS device includes a cavity and a stopper located at the top surface of the supporting substrate. A MEMS structure of the MEMS device includes a proof mass and a suspension beam connected to the proof mass. The proof mass and the suspension beam are formed by patterning a MEMS device layer using an etching process. During the etching process, the proof mass is bonded to the stopper through a bonding dielectric layer and supported by the stopper to avoid downward movement of the proof mass, thereby preventing movement of the suspension beam while patterning the MEMS device layer. Therefore, the suspension beam of the MEMS devices has a uniform pattern without striation at the sidewalls thereof. Then, a portion of the bonding dielectric layer between the proof mass and the stopper is removed to obtain a precisely controlled gap between the proof mass and the stopper of the MEMS devices. Therefore, the embodiments of the present disclosure improve the reliability and the production yield of the MEMS devices, and increase product flexibility of fabricating the MEMS devices.

Figure 2:
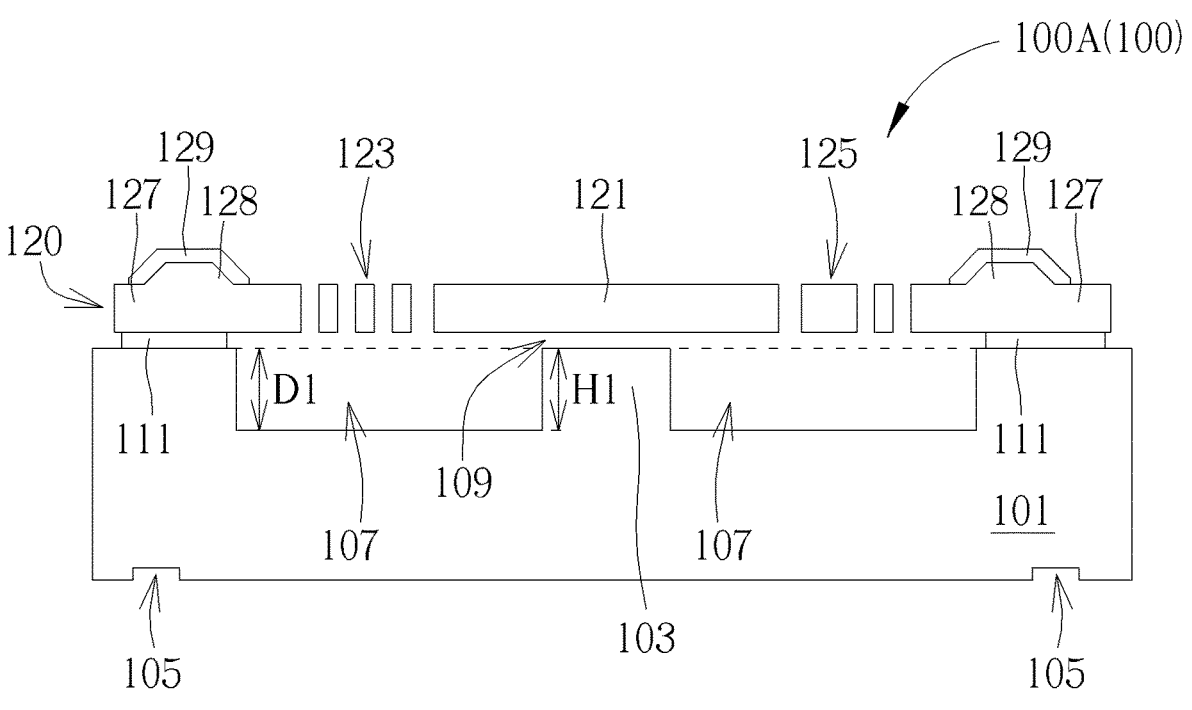
FIG. 2 shows schematic cross-sectional diagrams of MEMS devices according to some embodiments of the present disclosure.
Figure 2:
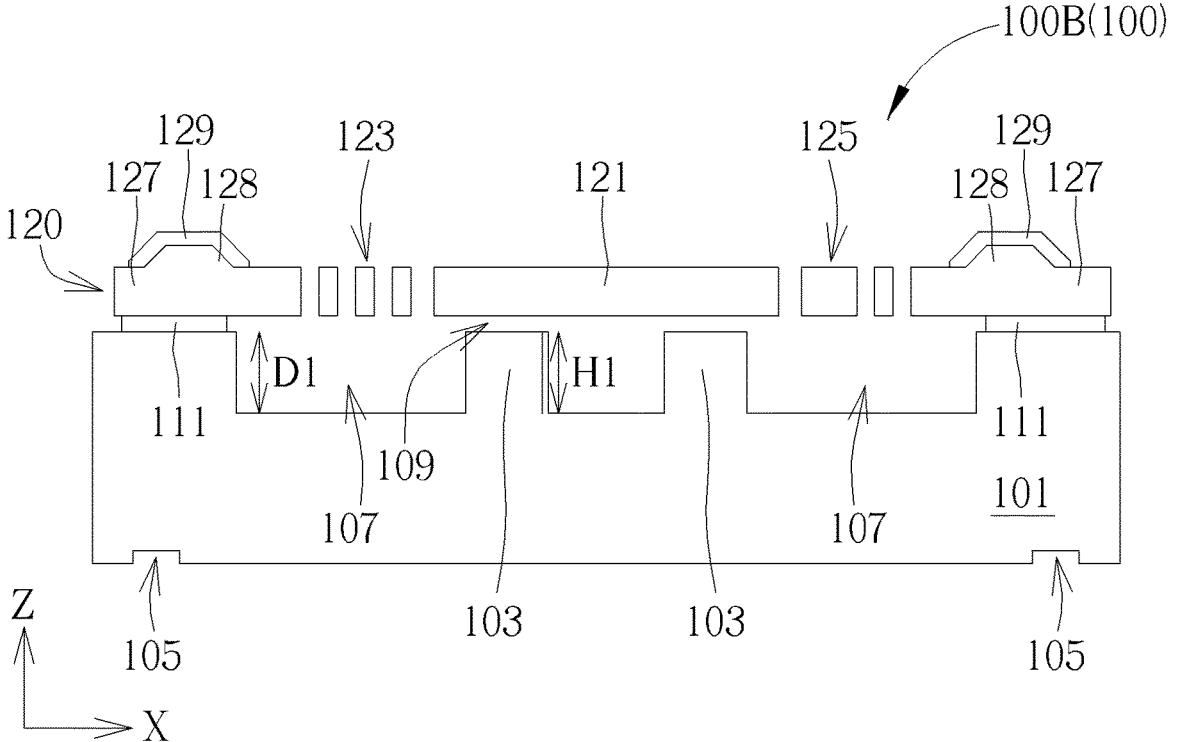

FIG. 1 shows a schematic top view of a MEMS device 100 according to some embodiments of the present disclosure. FIG. 2 shows schematic cross-sectional diagrams of MEMS devices 100A and 100B that are taken from a cross-sectional line T-T of FIG. 1 according to some embodiments of the present disclosure. Referring to FIG. 1, the MEMS device 100 includes a MEMS structure 120 disposed on a supporting substrate 101, where a top view of a stopper 103 and a cavity 107 of the MEMS device 100 is also shown in FIG. 1 by dashed lines. The MEMS structure 120 includes a proof mass 121, a suspension beam 123, a suspension comb 125 and multiple fixed portions 127. As shown in FIG. 1, one end of the suspension beam 123 is connected to the left fixed portion 127, and another end of the suspension beam 123 is connected to the proof mass 121. Moreover, the right fixed portion 127 includes a comb portion 127-1 and a main portion 127-2. The suspension comb 125 extends from the proof mass 121 and is interdigitated with the comb portion 127-1 of the fixed portion 127. The shapes and arrangement of the proof mass 121, the suspension beam 123, the suspension comb 125 and the fixed portions 127 illustrated in FIG. 1 are for examples, and should not be construed in a limiting sense. Besides, more than one suspension beams may be connected to the proof mass 121, and the suspension comb 125 may be replaced with the suspension beam 123 depending on various design requirements. During operation, the suspension beam 123 may be deformed (e.g. compressed or extended) like a spring when the MEMS structure 120 is moved or rotated by an external force, which in turn causes the change in the distance between the fixed portions 127 and the proof mass 121. Since the distance between the comb portion 127-1 and the suspension comb 125 is inversely proportional to the capacitance between comb portion 127-1 and the suspension comb 125, the acceleration and/or angular velocity of MEMS structure 120 may be determined by measuring the change in the capacitance between comb portion 127-1 and the suspension comb 125.

Referring to FIG. 2, in one embodiment, a MEMS device 100A includes a supporting substrate 101. The supporting substrate 101 may be a silicon (Si) wafer or other suitable semiconductor wafer. The material of the supporting substrate 101 includes a single crystal semiconductor material, such as silicon, sapphire or other suitable semiconductor materials, for example elementary semiconductors such as such as Ge; compound semiconductors such as GaN, SiC, GaAs, GaP, InP, InAs, and/or InSb; alloy semiconductors such as SiGe, GaAsP, AlInAs, AlN, AlGaAs, GaInAs, GaInP, GaInAsP, or a combination thereof. A cavity 107 is formed at a first surface such as the top surface of the supporting substrate 101. In addition, a stopper 103 is formed in and adjacent to the cavity 107 at the top surface of the supporting substrate 101, and the stopper 103 may be integral to the supporting substrate 101. The top surface of the stopper 103 and the top surface of the supporting substrate 101 are on the same level in a height. As shown in the MEMS device 100A of FIG. 2, the depth D1 of the cavity 107 is substantially equal to the height H1 of the stopper 103 based on the bottom surface of the cavity 107. In some embodiments, the stopper 103 and the supporting substrate 101 is an integrally formed structure.

The MEMS device 100A further includes a MEMS structure 120 disposed on the supporting substrate 101. The MEMS structure 120 may be formed from a silicon wafer, a polysilicon layer or other suitable semiconductor layer. In some embodiments, the MEMS structure 120 includes a proof mass 121, a suspension beam 123, a suspension comb 125, a fixed portion 127 adjacent to the suspension beam 123, and another fixed portion 127 adjacent to the suspension comb 125. The proof mass 121 is disposed directly above the stopper 103. The suspension beam 123 and the suspension comb 125 are disposed directly above the cavity 107. The fixed portions 127 are disposed directly above the region of the supporting substrate 101 surrounding the cavity 107.

Referring to FIG. 2, the MEMS device 100A further includes a bonding dielectric layer 111 disposed between the top surface of the supporting substrate 101 and the bottom surface of the MEMS structure 120. The bonding dielectric layer 111 may be a silicon oxide layer. The fixed portions 127 of the MEMS structure 120 are bonded to the supporting substrate 101 through the bonding dielectric layer 111. The bonding dielectric layer 111 is disposed on the top surface of the supporting substrate 101 and does not extend into the sidewalls and the bottom surface of the cavity 107. The bonding dielectric layer 111 does also not cover the stopper 103, i.e., the bonding dielectric layer 111 does not extend onto the sidewalls and the top surface of the stopper 103. In addition, there is a gap 109 between the stopper 103 and the proof mass 121 of the MEMS device 100A. According to the embodiments of the present disclosure, a dimension of the gap 109 in the direction of the height of the MEMS device 100A, for example a Z-axial direction as shown in FIG. 2, is substantially the same as the thickness of the bonding dielectric layer 111. For example, the dimension of the gap 109 and the thickness of the bonding dielectric layer 111 may be about 1 micrometer (μm) to about 5 μm, but not limited thereto. According to some embodiments of the present disclosure, the dimension of the gap 109 of the MEMS devices may be precisely controlled by adjusting the thickness of the bonding dielectric layer 111. The gap 109 should be properly controlled in a way that the proof mass 121 can be suspended over the stopper 103 during the operation of the MEMS device 100A. Besides, when a force is suddenly applied to the MEMS device 100A along a z-axis, the stopper 103 can be used to damp the z-axis movement of the proof mass 121 and thus increase the performance of the MEMS device 100A.

In addition, the supporting substrate 101 may further include alignment marks 105 formed on the bottom surface of the supporting substrate 101. The alignment marks 105 are used for helping alignment between the MEMS structure 120 and the supporting substrate 101 while the MEMS structure 120 is bonded to the supporting substrate 101.

As shown in the MEMS device 100A of FIG. 2, in some embodiments, the MEMS structure 120 further includes a protruding portion 128 disposed on the fixed portion 127 and a conductive wire 129 conformally disposed on the protruding portion 128. In a case where the MEMS device 100A is an accelerometer or a gyroscope, the proof mass 121 may function as a movable proof mass. During the operation of the MEMS device 100A, the movable proof mass 121 may be displaced from its original place when an external force is applied to the MEMS device 100A, the suspension beam 123 may vibrate at a resonance frequency, and the suspension comb 125 may be displaced from the comb portion 127-1 of the fixed portion 127. The degree of the displacements of the movable proof mass 121, the suspension beam 123 and the suspension comb 125 are translated into electrical signals and then delivered to an external circuit through the conductive wire 129.

Referring to FIG. 2 again, according to another embodiment of the present disclosure, a MEMS device 100B is provided. The difference between the MEMS device 100B and the MEMS device 100A is that the MEMS device 100B includes more than one stopper such as two stoppers 103 disposed directly under the proof mass 121 of the MEMS structure 120. The two stoppers 103 are also disposed in and adjacent to the cavity 107 of the supporting substrate 101. In addition, the top surfaces of the two stoppers 103 and the top surface of the supporting substrate 101 are on the same level in the height of the MEMS device 100B. Moreover, a dimension of a gap between the left stopper 103 and the proof mass 121, and a dimension of another gap between the right stopper 103 and the proof mass 121 in the direction of the height of the MEMS device 100B are also substantially the same as the thickness of the bonding dielectric layer 111. In some embodiments, the two stoppers 103 and the supporting substrate 101 are an integrally formed structure.

Figure 3:
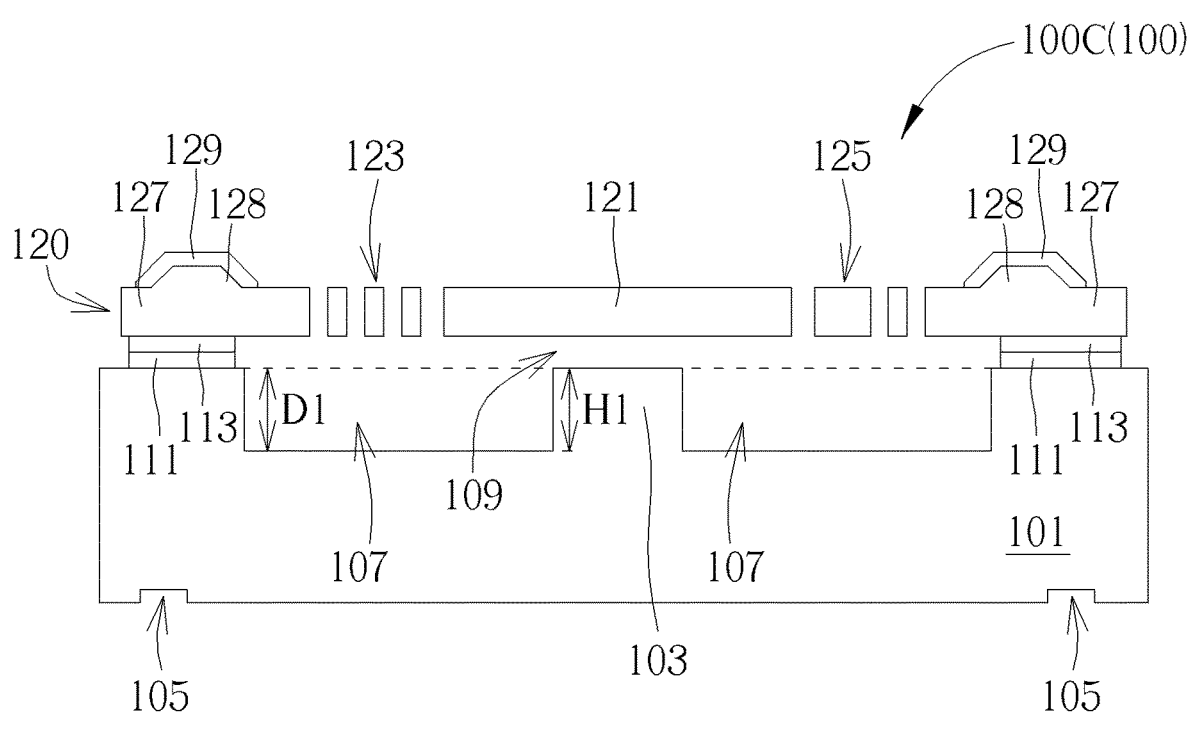
FIG. 3 shows schematic cross-sectional diagrams of MEMS devices according to some other embodiments of the present disclosure.
Figure 3:
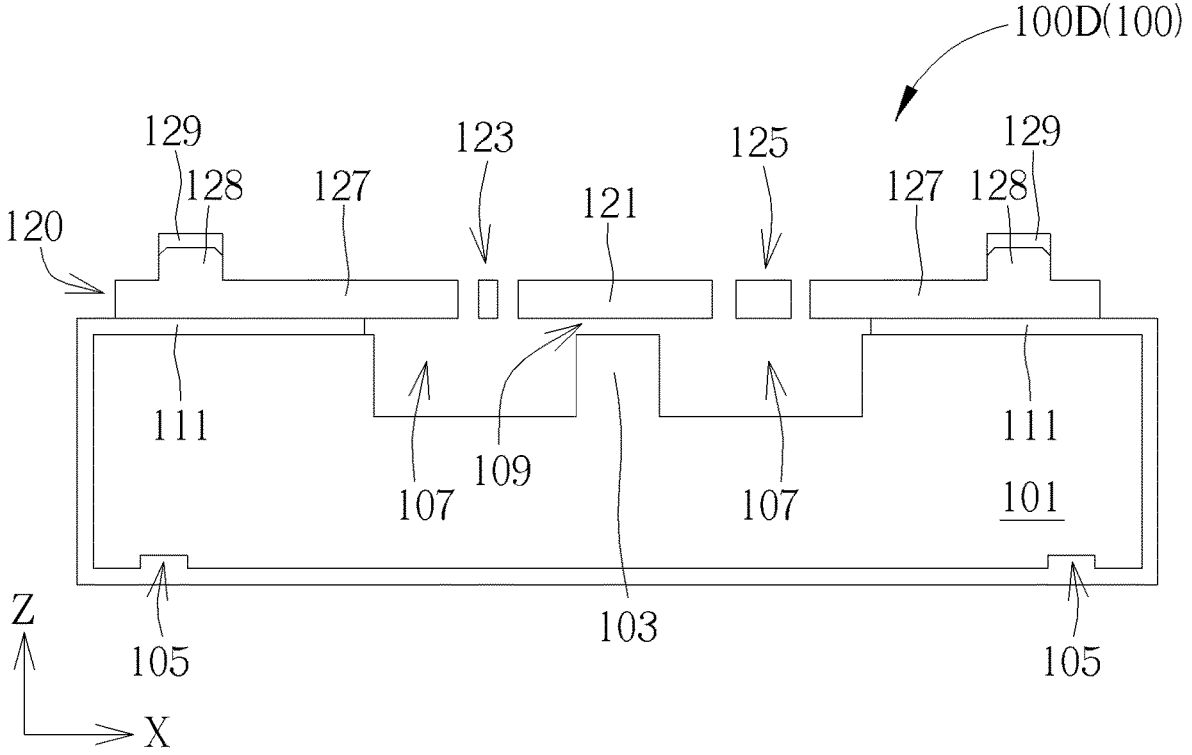

FIG. 3 shows schematic cross-sectional diagrams of MEMS devices according to some other embodiments of the present disclosure. Referring to FIG. 3, in one embodiment, a MEMS device 100C is provided. The difference between the MEMS device 100C and the MEMS device 100A is that the MEMS device 100C further includes a dielectric layer 113 disposed between the bottom surface of the MEMS structure 120 and the bonding dielectric layer 111. The dielectric layer 113 may be a silicon oxide layer. The MEMS device 100C includes a gap 109 between the stopper 103 and the proof mass 121. In this embodiment, a dimension of the gap 109 in the direction of the height of the MEMS device 100C is substantially the same as the total thickness of the bonding dielectric layer 111 and the dielectric layer 113. The dimension of the gap 109 of the MEMS device 100C is precisely controlled by both the thickness of the bonding dielectric layer 111 and the thickness of the dielectric layer 113.

Referring to FIG. 3 again, in another embodiment, a MEMS device 100D is provided. The difference between the MEMS device 100D and the MEMS device 100A is that the bonding dielectric layer 111 of the MEMS device 100D further extends to wrap around the sidewalls and the bottom surface of the supporting substrate 101. In addition, the MEMS structure 120 of the MEMS device 100D may be different from the MEMS structure 120 of the MEMS device 100A. For example, the patterns of the proof mass 121, the suspension beam 123, the suspension comb 125 and the fixed portions 127 of the MEMS structure 120 of the MEMS device 100D are different from those of the MEMS structure 120 of the MEMS device 100A. Moreover, the cross-sectional shape of the protruding portion 128 and the disposed position of the conductive wire 129 of the MEMS structure 120 of the MEMS device 100D are also different from those of the MEMS structure 120 of the MEMS device 100A.

Figure 4:
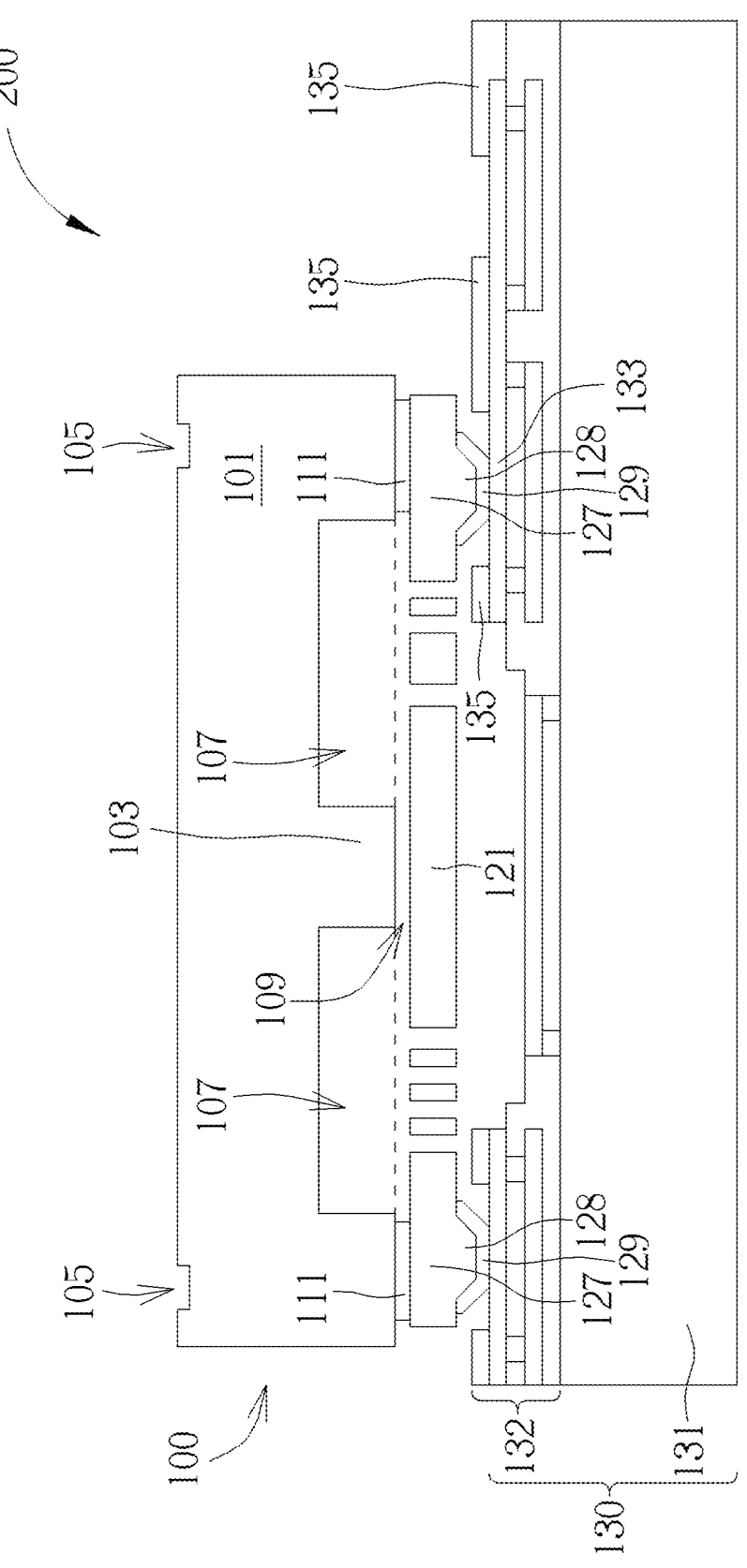
FIG. 4 shows a schematic cross-sectional diagram of a structure including a MEMS device after bonded with a CMOS wafer according to one embodiment of the present disclosure.

FIG. 4 shows a schematic cross-sectional diagram of a structure including a MEMS device bonded with a complementary metal oxide semiconductor (CMOS) wafer according to one embodiment of the present disclosure. Referring to FIG. 4, a structure 200 includes a MEMS device 100 bonded with a CMOS wafer 130. The MEMS device 100 may be or be derived from, for example any one of the MEMS devices 100A, 100B, 100C and 100D as shown in FIG. 2 and FIG. 3. The CMOS wafer 130 includes a semiconductor substrate 131 and an interconnect layer 132 formed on the semiconductor substrate 131. The semiconductor substrate 131 includes multiple CMOS transistors and other semiconductor elements formed therein. The interconnect layer 132 is constructed of multiple metal layers, multiple dielectric layers, and multiple vias for electrically connecting to the CMOS transistors and the semiconductor elements in the semiconductor substrate 131. The topmost metal layer of the interconnect layer 132 may function as a bonding pad 133. The conductive wire 129 of the MEMS device 100 is bonded to the bonding pad 133 in the interconnect layer 132 of the CMOS wafer 130. Therefore, the electrical signals of the MEMS device 100 are transferred to the CMOS wafer 130 through the conductive wire 129 and the interconnect layer 132. In addition, a passivation layer 135 is disposed on the bonding pad 133 and has at least one opening or multiple openings to expose the bonding pad 133.

Figure 5:
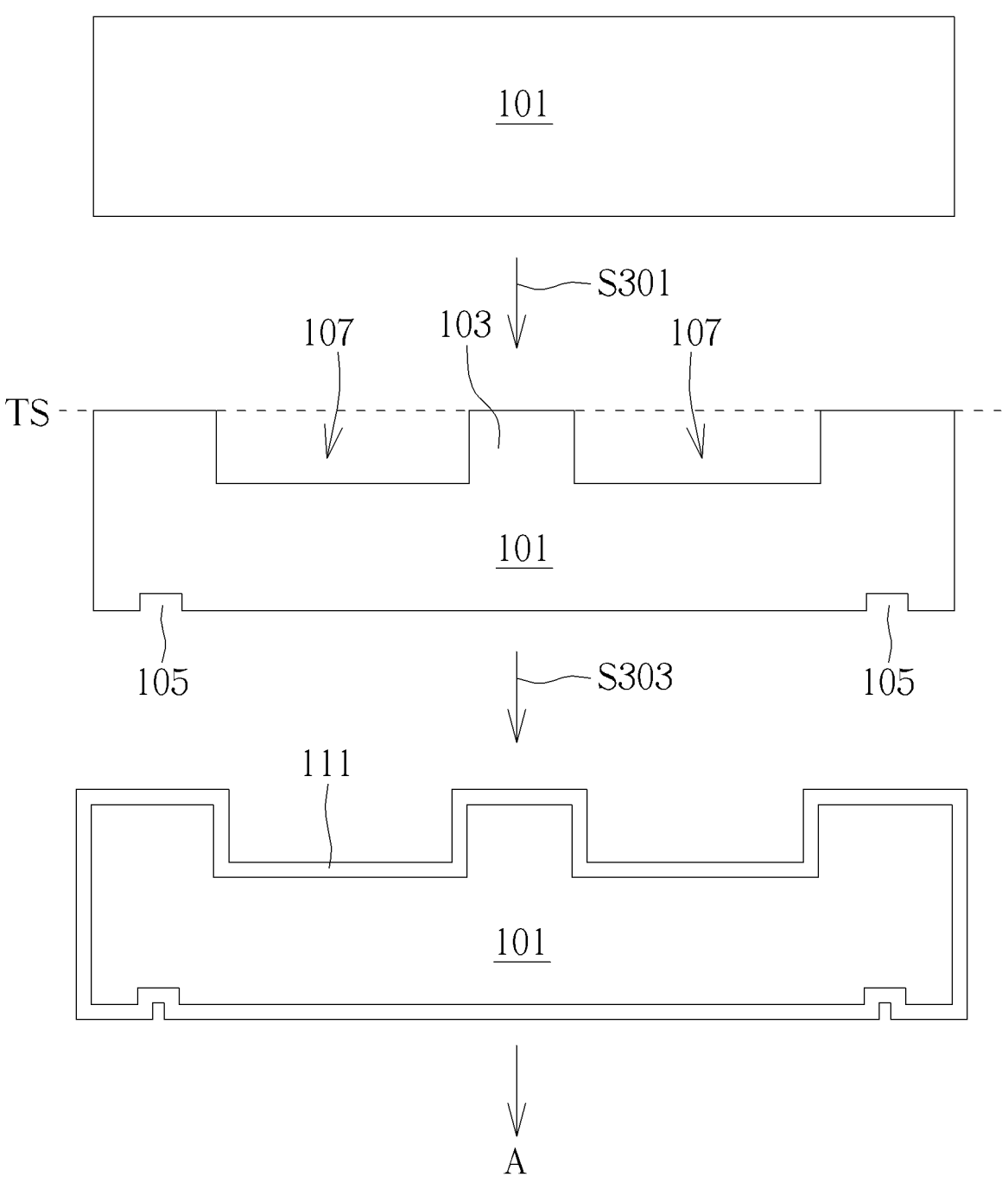
FIG. 5, FIG. 6 and FIG. 7 show schematic cross-sectional diagrams of several stages of a method of fabricating a MEMS device according to one embodiment of the present disclosure.
Figure 6:
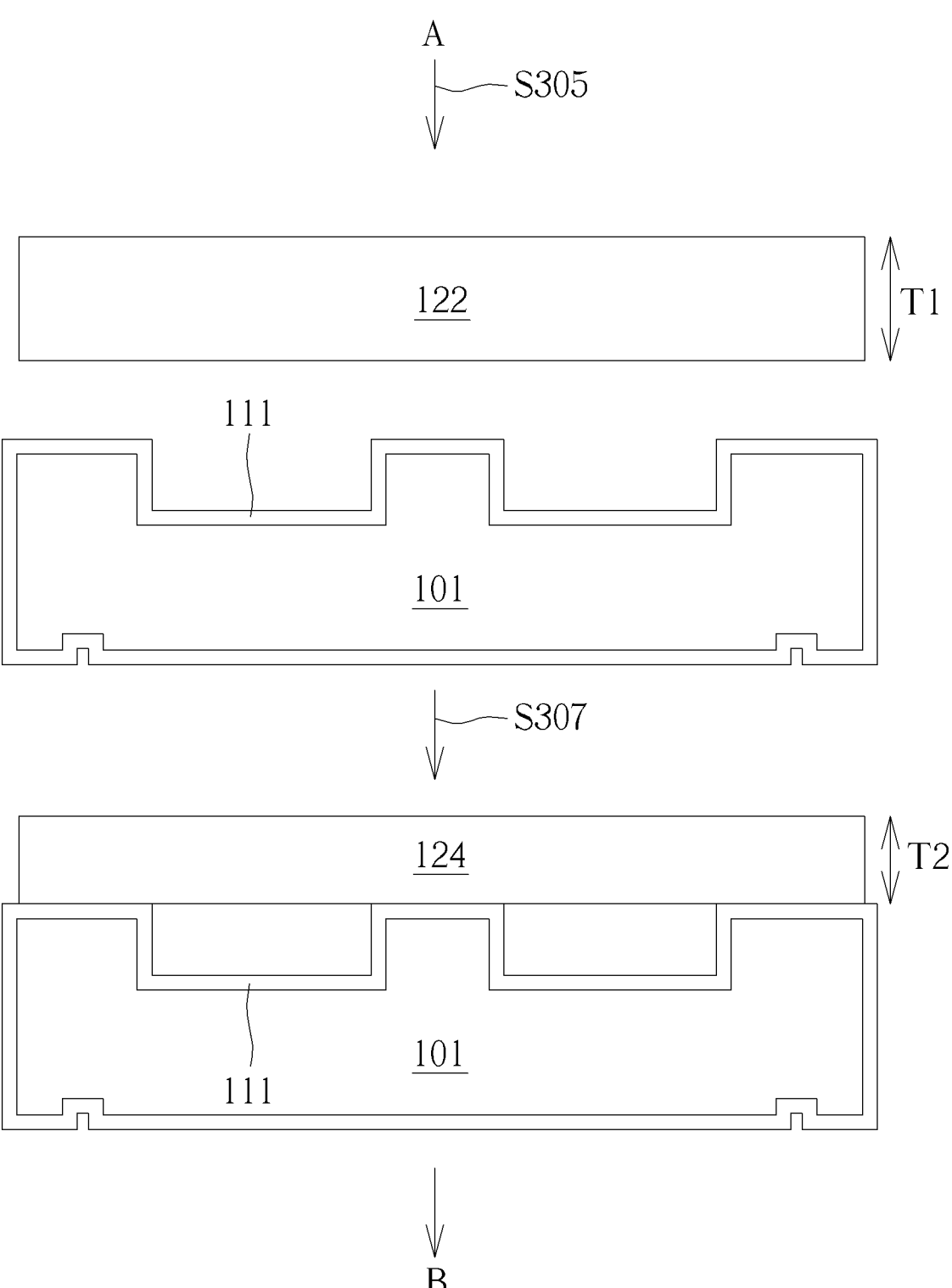
Figure 7:
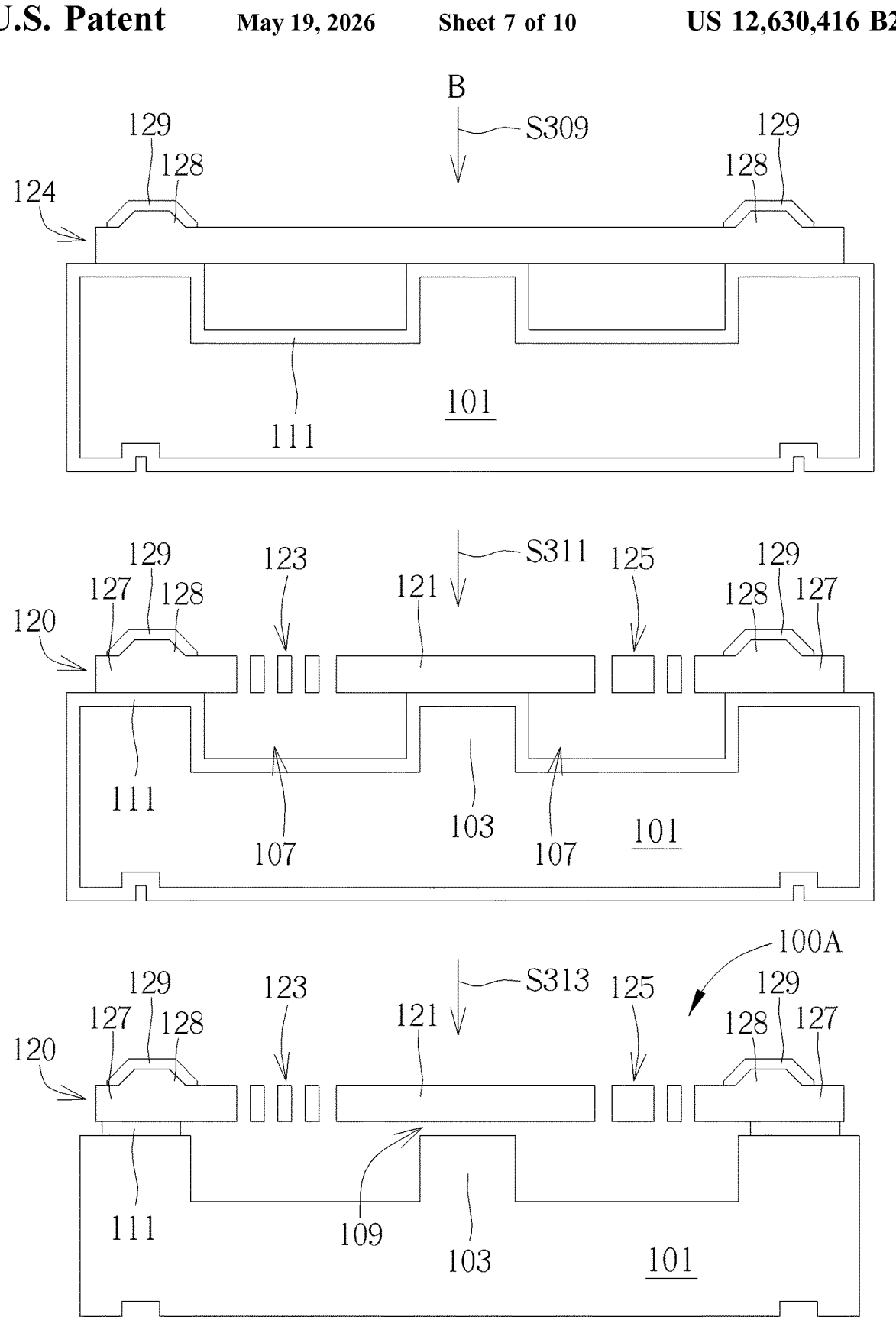

FIG. 5, FIG. 6 and FIG. 7 show schematic cross-sectional diagrams of several stages of a method of fabricating a MEMS device according to one embodiment of the present disclosure. Referring to FIG. 5, first, a supporting substrate 101 is provided. The supporting substrate 101 may be a silicon wafer, but not limited thereto. Next, at step S301, the supporting substrate 101 is etched to form a cavity 107 at the top surface of the supporting substrate 101 and a stopper 103 in and adjacent to the cavity 107. In some embodiments, the stopper 103 and the cavity 107 are formed together in the same etching process step. Moreover, the top surface of the stopper 103 and the top surface of the supporting substrate 101 are on the same level in the height, as shown in a dashed line TS of FIG. 5. The depth of the cavity 107 is substantially the same as the height of the stopper 103 based on the bottom surface of the cavity 107. In this embodiment, the stopper 103 and the supporting substrate 101 are an integrally formed structure. In addition, several alignment marks 105 may be formed on the bottom surface of the supporting substrate 101 by using an etching process. Then, at step S303, a bonding dielectric layer 111 such as a silicon oxide layer is conformally formed on the supporting substrate 101, in the cavity 107 and on the stopper 103. The bonding dielectric layer 111 wraps around the top surface, the sidewalls and the bottom surface of the supporting substrate 101. The bonding dielectric layer 111 also extends onto the sidewalls and the bottom surface of the cavity 107, and extends onto the sidewalls and the top surface of the stopper 103. The bonding dielectric layer 111 may be formed by a thermal growth process (such as a thermal oxidation process or a thermal nitridation process), a plasma-enhanced chemical vapor disposition (PECVD) process from tetraethoxy silane (TEOS), or an atomic layer deposition, but not limited thereto. In some embodiments, the thickness of the bonding dielectric layer 111 may be in a range of about 1 μm to about 5 μm, but not limited thereto.

Next, referring to FIG. 6, at step S305, a MEMS wafer 122 is provided. The MEMS wafer 122 is for example a silicon wafer and used for forming a MEMS structure at the subsequent process steps. The MEMS wafer 122 has a thickness T1, for example about 200 μm to about 1000 μm, but not limited thereto. Then, at step S307, first, the MEMS wafer 122 is bonded to the supporting substrate 101 and the stopper 103 through the bonding dielectric layer 111 using a fusion bonding process. Thereafter, the MEMS wafer 122 is thinned by a backside grinding process and a chemical mechanical polishing/planarization (CMP) process to form a MEMS device layer 124. The MEMS device layer 124 has a thickness T2 that is smaller than the thickness T1 of the MEMS wafer 122. The thickness T2 of the MEMS device layer 124 is for example about 10 μm to about 500 μm, but not limited thereto.

Next, referring to FIG. 7, at step S309, the MEMS device layer 124 is etched to form multiple protruding portions 128 such as a stand-off structure at the top surface of the MEMS device layer 124. Then, a conductive wire 129 is conformally formed on the protruding portion 128. The conductive wire 129 may be formed by depositing a conductive material layer such as a metal layer or a semiconductor layer and then patterning the conductive material layer to form the conductive wire 129.

Thereafter, still referring to FIG. 7, at step S311, the MEMS device layer 124 is patterned by a photolithography and etching process to form a proof mass 121, a suspension beam 123, a suspension comb 125 and fixed portions 127 to construct a MEMS structure 120. According to the embodiments of the present disclosure, during the patterning process of forming the proof mass 121, the suspension beam 123, the suspension comb 125 and fixed portions 127, etchant such as vapor HF is applied to the MEMS device layer 124, but not limited thereto, and the MEMS device layer 124 exposed from the patterned mask (not shown) can be gradually etched away by the etchant. While the MEMS device layer 124 is continuously patterned to have portions of the MEMS device layer 124 etched through and to thereby form fine lines of the suspension beam 123 and the suspension comb 125, the heavy proof mass 121 is supported by and bonded to the stopper 103 to avoid movement. Therefore, there is no striation produced at the sidewalls of the fine lines of the suspension beam 123 and the suspension comb 125, and the suspension beam 123 and the suspension comb 125 have uniform pattern. The suspension beam 123 and the suspension comb 125 with uniform pattern and striation free are useful to improve the reliability and the production yield of the MEMS devices, thereby reducing the variation in the electrical and mechanical properties of the MEMS structures across the wafer.

Next, still referring to FIG. 7, at step S313, a portion of the bonding dielectric layer 111 between the proof mass 121 and the stopper 103 is removed by an etching process to thereby form a gap 109. At the same time, the proof mass 121 of the MEMS structure 120 is released to become movable. In this embodiment, the dimension of the gap 109 in the direction of the height is precisely controlled by the thickness of the bonding dielectric layer 111. In addition, the thickness of the bonding dielectric layer 111 is increased while the weight of the proof mass 121 is increased. According to the embodiments of the present disclosure, the fabrication of the suspension beam 123 and the suspension comb 125 is not confined by the proof mass 121. Moreover, the dimension of the gap 109 may have more design flexibility even if the weight of the proof mass 121 is increased or decreased, thereby increasing the product flexibility of the MEMS devices of the present disclosure. Furthermore, the other portions of the bonding dielectric layer 111 on the sidewalls and the bottom surface of the cavity 107 and on the sidewalls of the stopper 103 are also removed by the same etching process step of forming the gap 109. The etching process is for example a vapor hydrofluoric acid (VHF) release process. In one embodiment, another portion of the bonding dielectric layer 111 on the sidewalls and the bottom surface of the supporting substrate 101 may be removed by another etching process such as a dry etching or a wet etching process. The remained portion of the bonding dielectric layer 111 is between the top surface of the supporting substrate 101 and the bottom surface of the MEMS structure 120 to obtain the MEMS device 100A.

Figure 8:
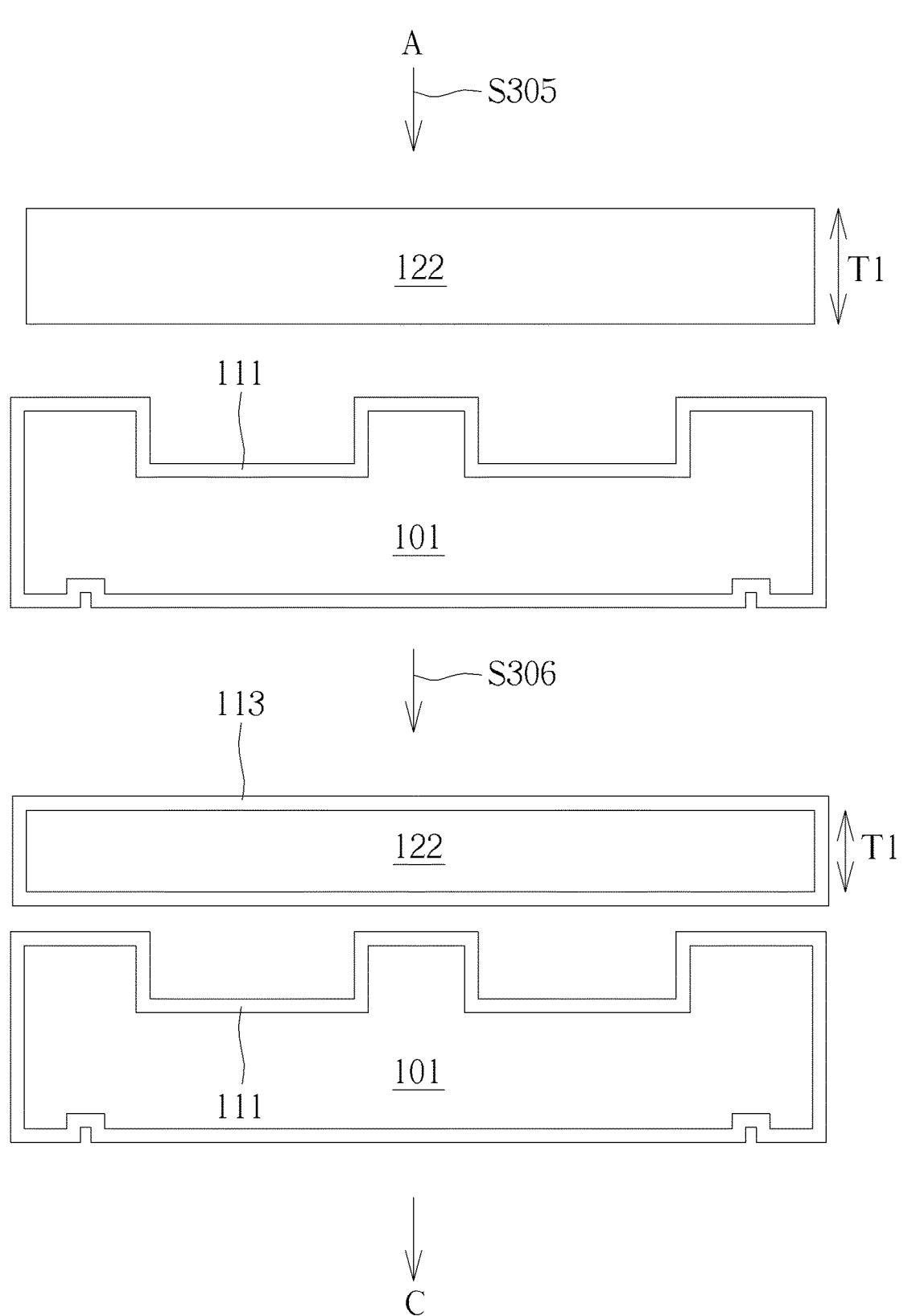
FIG. 8, FIG. 9 and FIG. 10 show schematic cross-sectional diagrams of several stages of a method of fabricating a MEMS device according to another embodiment of the present disclosure.
Figure 9:
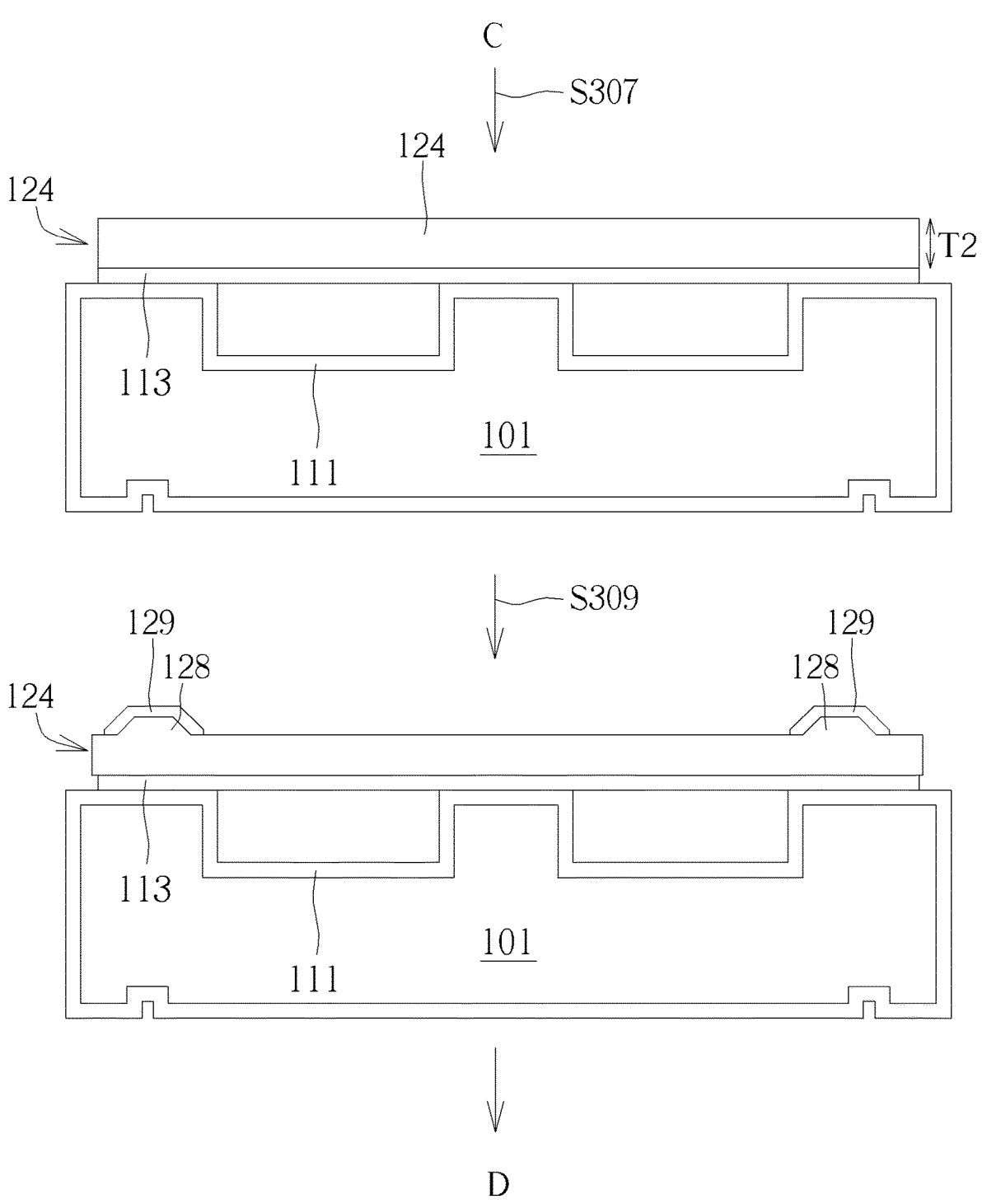
Figure 10:
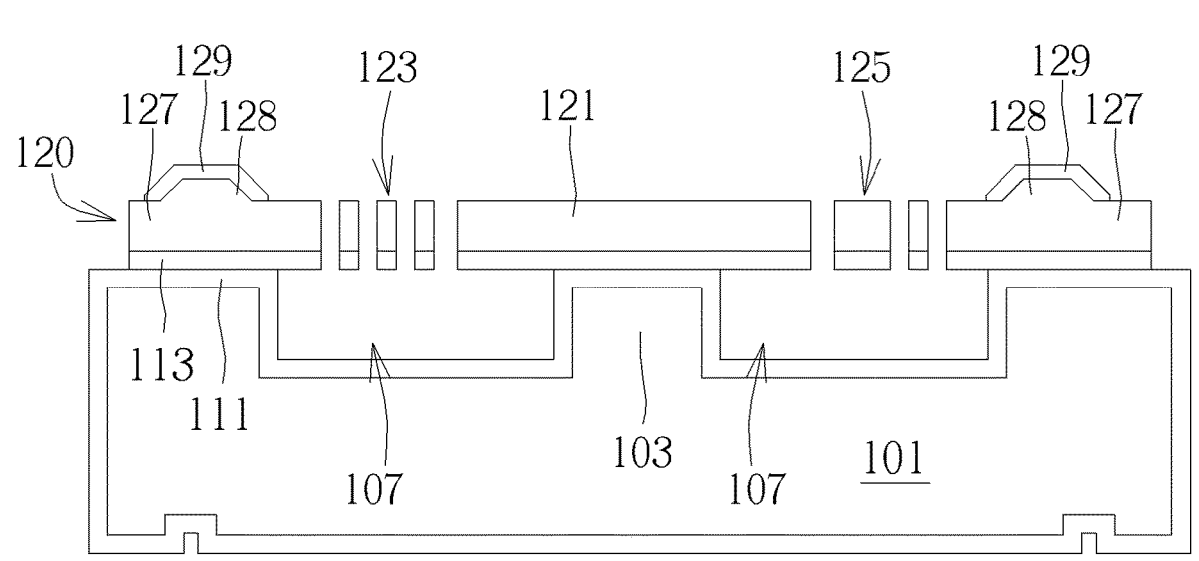
Figure 10:
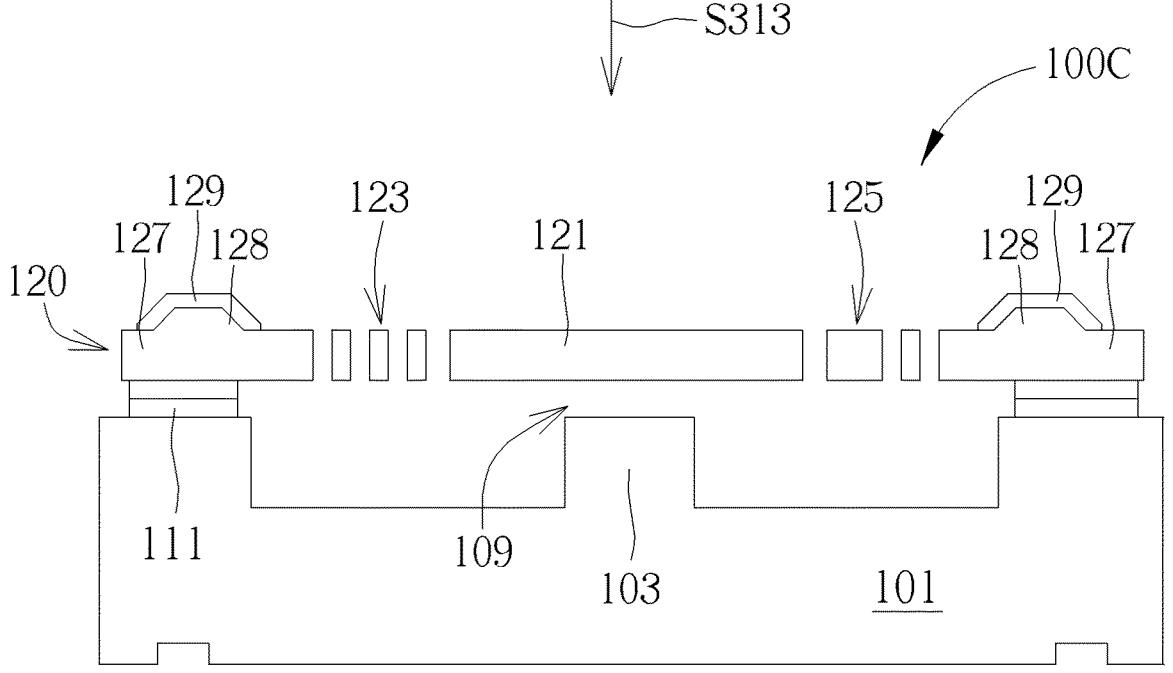

FIG. 8, FIG. 9 and FIG. 10 show schematic cross-sectional diagrams of several stages of a method of fabricating a MEMS device according to another embodiment of the present disclosure. Referring to FIG. 8, after the steps S301 and S303 of FIG. 5, at step S305, a MEMS wafer 122 is provided. The MEMS wafer 122 is for example a silicon wafer and used for forming a MEMS structure at the subsequent process steps. The MEMS wafer 122 has a thickness T1, for example about 200 μm to about 1000 μm, but not limited thereto. Then, at step S306, a dielectric layer 113 such as a silicon oxide layer is conformally formed on the MEMS wafer 122 to wrap around the top surface, the sidewalls and the bottom surface of the MEMS wafer 122. The dielectric layer 113 may be formed by a thermal growth process (such as a thermal oxidation process or a thermal nitridation process), a plasma-enhanced chemical vapor disposition (PECVD) process from tetraethoxy silane (TEOS), or anatomic layer deposition, but is not limited thereto. In some embodiments, the thickness of the dielectric layer 113 may be in a range of about 1 μm to about 5 μm, but not limited thereto.

Next, referring to FIG. 9, at step S307, the MEMS wafer 122 is bonded to the supporting substrate 101 and the stopper 103 through the bonding dielectric layer 111 and the dielectric layer 113 using a fusion bonding process, where the bonding dielectric layer 111 and the dielectric layer 113 have a dielectric-to-dielectric bonding therebetween. Then, the MEMS wafer 122 is thinned by a grinding process and a CMP process to form a MEMS device layer 124. The MEMS device layer 124 has a thickness T2 that is smaller than the thickness T1 of the MEMS wafer 122. The thickness T2 of the MEMS device layer 124 is for example about 10 μm to about 500 μm, but not limited thereto. In addition, after the MEMS wafer 122 is thinned to form the MEMS device layer 124, some portions of the dielectric layer 113 on the top surface and the sidewalls of the MEMS wafer 122 are also removed. The remained portion of the dielectric layer 113 is between the bottom surface of the MEMS device layer 124 and the bonding dielectric layer 111.

Then, still referring to FIG. 9, at step S309, the MEMS device layer 124 is etched to form multiple protruding portions 128 such as a stand-off structure at the top surface of the MEMS device layer 124. Thereafter, a conductive wire 129 is conformally formed on the protruding portion 128 by depositing and patterning processes.

Next, referring to FIG. 10, at step S311, the MEMS device layer 124 is patterned by an etching process to form a proof mass 121, a suspension beam 123, a suspension comb 125 and fixed portions 127 to construct a MEMS structure 120. In addition, the dielectric layer 113 on the bottom surface of the MEMS device layer 124 is also patterned by the etching process of forming the MEMS structure 120. According to the embodiments of the present disclosure, while the MEMS device layer 124 is continuously patterned to form fine lines of the suspension beam 123 and the suspension comb 125, the heavy proof mass 121 is bonded to and supported by the stopper 103 to avoid movement. Therefore, there is no striation produced at the sidewalls of the fine lines of the suspension beam 123 and the suspension comb 125 and the pattern of the suspension beam 123 and the suspension comb 125 is uniform. The suspension beam 123 and the suspension comb 125 with uniform pattern and striation free are useful to improve the reliability and the production yield of the MEMS devices. In addition, according to the embodiments of the present disclosure, the fabrication of the suspension beam 123 and the suspension comb 125 is not confined by the proof mass 121, thereby increasing the product flexibility of the MEMS devices.

Next, still referring to FIG. 10, at step S313, a portion of the bonding dielectric layer 111 and a portion of the dielectric layer 113 between the proof mass 121 and the stopper 103 are removed by an etching process to form a gap 109 to release the proof mass 121 of the MEMS structure 120. In this embodiment, the dimension of the gap 109 in the direction of the height is precisely controlled by the thicknesses of the bonding dielectric layer 111 and the dielectric layer 113. Moreover, the total thickness of the bonding dielectric layer 111 and the dielectric layer 113 is increased while the weight of the proof mass 121 is increased. The dimension of the gap 109 may have more design flexibility even if the weight of the proof mass 121 is increased or decreased, thereby increasing the product flexibility of the MEMS devices of the present disclosure. In addition, the other portions of the bonding dielectric layer 111 on the sidewalls and the bottom surface of the cavity 107 and on the sidewalls of the stopper 103, and the other portions of the dielectric layer 113 in the region corresponding to the cavity 107 are also removed by the same etching process step of forming the gap 109. The etching process is for example a vapor hydrofluoric acid (VHF) release process. In one embodiment, another portion of the bonding dielectric layer 111 on the sidewalls and the bottom surface of the supporting substrate 101 may be removed by another etching process such as a dry etching or a wet etching process. The remained portions of the bonding dielectric layer 111 and the dielectric layer 113 both are disposed between the top surface of the supporting substrate 101 and the bottom surface of the MEMS structure 120 to obtain the MEMS device 100C.

The MEMS structures 120 of the MEMS devices 100A, 100B, 100C and 100D as shown in FIG. 2 and FIG. 3 are illustrated for examples, and should not be construed in a limiting sense. The MEMS devices of the present disclosure include inertial measurement units (IMU), inertial sensors, pressure sensors, micro-fluidic devices, other micro devices or a combination thereof, and the IMU includes an accelerometer, a gyroscope, or a combination thereof.

According to the embodiments of the present disclosure, the proof mass of the MEMS structure is bonded to and supported by the stopper to avoid the downward movement of the proof mass during etching the MEMS device layer to form fine pattern of other portions such as the suspension beam and the suspension comb of the MEMS structure. The fabrication process of the MEMS structure is not confined by the weight of the proof mass and not sensitive to the MEMS device designs, thereby increasing the product flexibility of the MEMS devices. Furthermore, the stopper also functions as a mechanical stopper against the shock applied to the MEMS devices.

In addition, the suspension beam and the suspension comb of the MEMS structure are striation free at the sidewalls thereof and have uniform pattern. Therefore, the production yield and the reliability of the MEMS devices are improved. Moreover, the dimension of the gap between the proof mass and the stopper is precisely controlled and flexibly adjusted by the thickness of the bonding dielectric layer or both the thicknesses of the bonding dielectric layer and the dielectric layer. Therefore, a variable gap between the proof mass and the stopper is obtained in the MEMS devices of the embodiments of the present disclosure. Furthermore, the stopper and the cavity are formed together in the supporting substrate at the same etching process step without additional photo-mask and etching process. Therefore, the fabrication time and cost of the MEMS devices are reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A micro-electro-mechanical system (MEMS) device, comprising:

a supporting substrate;

a cavity located at a top surface of the supporting substrate;

a stopper adjacent to the cavity, wherein a top surface of the stopper and the top surface of the supporting substrate are on the same level in a height;

a MEMS structure disposed on the supporting substrate, wherein the MEMS structure comprises a proof mass and a suspension beam, the proof mass is disposed directly above the stopper, and the suspension beam is disposed directly above the cavity, and wherein the MEMS structure further comprises a protruding portion and a conductive wire disposed on the protruding portion, and the conductive wire is bonded to a bonding pad of a complementary metal oxide semiconductor (CMOS) wafer so as to form a sequential stack of the protruding portion, the conductive wire and the bonding pad; and a bonding dielectric layer disposed between the top surface of the supporting substrate and a bottom surface of the MEMS structure.

2. The MEMS device of claim 1, wherein a gap is between the stopper and the proof mass, and a dimension of the gap in a direction of the height is the same as the thickness of the bonding dielectric layer.

3. The MEMS device of claim 1, wherein the bonding dielectric layer does not extend into the cavity.

4. The MEMS device of claim 1, wherein the bonding dielectric layer does not cover the stopper.

5. The MEMS device of claim 1, further comprising a dielectric layer disposed between the bottom surface of the MEMS structure and the bonding dielectric layer.

6. The MEMS device of claim 1, wherein the MEMS structure further comprises a fixed portion, one end of the suspension beam is connected to the fixed portion, and another end of the suspension beam is connected to the proof mass.

7. The MEMS device of claim 1, wherein the MEMS structure further comprises a suspension comb and a fixed portion, the suspension comb extends from the proof mass and is interdigitated with the fixed portion.

8. The MEMS device of claim 1, wherein the MEMS structure comprises an inertial measurement unit (IMU), and the IMU comprises an accelerometer, a gyroscope or a combination thereof.

9. The MEMS device of claim 1, wherein the stopper and the supporting substrate are an integrally formed structure.

10. The MEMS device of claim 1, further comprising a passivation layer disposed on the bonding pad of the CMOS wafer, wherein the passivation layer has multiple openings to expose the bonding pad.

11. A method of fabricating a micro-electro-mechanical system (MEMS) device, comprising:

providing a supporting substrate;

etching the supporting substrate to form a cavity and a stopper at a top surface of the supporting substrate, wherein the stopper is adjacent to the cavity, and a top surface of the stopper and the top surface of the supporting substrate are on the same level in a height;

forming a bonding dielectric layer on the top surface of the supporting substrate and on a top surface of the stopper;

disposing a MEMS device layer on the bonding dielectric layer, wherein the MEMS device layer is bonded to the stopper and the supporting substrate, wherein the bonding dielectric layer is disposed between the top surface of the supporting substrate and a bottom surface of the MEMS device layer, and;

patterning the MEMS device layer to form a MEMS structure, wherein the MEMS structure comprises a proof mass bonded to the stopper, a suspension beam formed directly above the cavity, a protruding portion, and a conductive wire disposed on the protruding portion, and the conductive wire is bonded to a bonding pad of a complementary metal oxide semiconductor (CMOS) wafer so as to form a sequential stack of the protruding portion, the conductive wire and the bonding pad; and removing a portion of the bonding dielectric layer disposed between the stopper and the proof mass to form a gap between the stopper and the proof mass.

12. The method of claim 11, wherein after the suspension beam is formed, the portion of the bonding dielectric layer on the stopper is removed by an etching process.

13. The method of claim 11, wherein forming the bonding dielectric layer comprises a thermal oxidation process or a deposition process, and the bonding dielectric layer is conformally formed on sidewalls and a bottom surface of the cavity, and on sidewalls and a bottom surface of the supporting substrate.

14. The method of claim 13, wherein a first portion of the bonding dielectric layer on the sidewalls and the bottom surface of the cavity, and a second portion of the bonding dielectric layer on the sidewalls and the bottom surface of the supporting substrate are removed together with the portion of the bonding dielectric layer on the stopper by the same etching process.

15. The method of claim 11, wherein a dimension of the gap in a direction of the height is the same as the thickness of the bonding dielectric layer.

16. The method of claim 11, further comprising:

providing a MEMS wafer;

bonding the MEMS wafer to the supporting substrate;

thinning the MEMS wafer to form the MEMS device layer;

etching the MEMS device layer to form the protruding portion of the MEMS structure before forming the proof mass;

forming the conductive wire on the protruding portion of the MEMS structure;

providing the complementary metal oxide semiconductor (CMOS) wafer including an interconnect layer thereon; and bonding the MEMS structure to the CMOS wafer, wherein the conductive wire is electrically coupled to the interconnect layer.

17. The method of claim 11, wherein patterning the MEMS device layer to form the MEMS structure further comprises forming a fixed portion, and a suspension comb, wherein the suspension comb extends from the proof mass and is interdigitated with the fixed portion.

18. The method of claim 11, wherein patterning the MEMS device layer to form the MEMS structure further comprises forming a fixed portion, one end of the suspension beam is connected to the fixed portion, and another end of the suspension beam is connected to the proof mass.

19. The method of claim 11, wherein before disposing the MEMS device layer on the bonding dielectric layer, further comprising forming a dielectric layer on the MEMS device layer, wherein the dielectric layer is between the MEMS device layer and the bonding dielectric layer after disposing the MEMS device layer on the bonding dielectric layer.

\* \* \* \* \*